US 6,621,001 B2

(12) United States Patent
Kroog et al.

(10) Patent No.: US 6,621,001 B2
(45) Date of Patent: Sep. 16, 2003

(54) FLOATING DOOR SYSTEM FOR RF ENCLOSURES

(75) Inventors: Helmuth O. Kroog, Berthoud, CO (US); Timothy A. Lock, Fort Collins, CO (US); William R. Miner, Windsor, CO (US); Grant E. Cashen, Loveland, CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 2 days.

(21) Appl. No.: 10/001,629

(22) Filed: Oct. 31, 2001

(65) Prior Publication Data

US 2003/0079892 A1 May 1, 2003

(51) Int. Cl.[7] .................................................. H05K 9/00
(52) U.S. Cl. ................................ 174/35 R; 174/35 GC; 361/800; 361/816
(58) Field of Search ......................... 174/35 R, 35 GC; 361/799, 800, 816, 818; 277/920; 439/607, 609, 927

(56) References Cited

U.S. PATENT DOCUMENTS 6,395,976 B1 * 5/2002 Koradia et al. ........ 174/35 GC

* cited by examiner

Primary Examiner—Dean A. Reichard
Assistant Examiner—Carmelo Oliva

(57) ABSTRACT

A system and method for radio frequency (RF) sealing a door of an RF enclosure is disclosed. The door employs a two-axis gimbal system to provide two degrees of freedom as the drawer door makes contact with the RF enclosure. The two-axis gimbal system allows the forces applied to the sealing gasket to be uniform along the length of the seal. This enables uniform seal compression, and therefore, uniform RF isolation. The door is held rigid while the door gasket is not affecting a seal against the frame of the RF enclosure. As the door becomes engaged with the frame, multiple contact points of the drawer door are deactivated thereby allowing the drawer door to pivot near the seal centroid on a two-axis gimbal system. The two-axis gimbal system allows the RF seal to be applied uniformly across the length of the seal.

17 Claims, 5 Drawing Sheets

FLOATING DOOR SYSTEM FOR RF ENCLOSURES

TECHNICAL FIELD

This invention relates generally to the field of radio frequency (RF) shielding systems, and more specifically to the design of door systems for RF enclosures.

BACKGROUND OF THE INVENTION

RF sealing is employed in test and production environments where the amount of radiation emitted or absorbed by an electronic device must be closely controlled. Excess RF exposure can lead to erroneous test results, or in production and operational environments, degrade the performance of equipment sensitive to the emitted radiation. RF sealing is also important when an electronic component emits sufficient radiation to impact the performance of other proximate electronic components. In this second case, RF sealing isolates the source of radiation, while the first case may be used to isolate sensitive RF components. RF sealing requires close attention wherever an opening is required. RF seals that are dependent on compressed gaskets perform relative to the amount of compression on the gasket. Data provided by Instrument Specialties®, for instance, clearly relate isolation quality to gasket compression. This is a simple problem for access panels where one can achieve the proper level of gasket compression using screws. However, an active opening such as a door-RF enclosure interface, that employs a similar seal, induces additional design difficulties in order to achieve uniform seal compression. The compression uniformity must extend around the entire length of the seal. Furthermore, the compression of the gasket induces reactive forces that cause elastic materials to deflect. The reactive deflection of components causes non-uniformity in the gaskets compression and as a result degrades the RF seal quality.

When the RF seal to the RF enclosure is a drawer door, several more design considerations must be included. The drawer door must be rigid enough to support a load and ensure a uniform seal across the length of the door-enclosure interface. One technique to address this rigidity requirement is to use precision machining and rigidity of mating components. This approach is costly, due to the price of precision machining. Other systems accept an RF seal with non-uniform compression in order to save the expenses associated with the precision machining. However, non-uniform compression results in non-uniform RF isolation. In addition to the RF seal requirements, the drawer door must be rigid enough to withstand loads along the axis of the drawer door as well as perpendicular to the door axis. For this reason, drawer door RF seal systems do not generally employ a gimbal system on the door. The use of a gimbal system allows the door to "float" on one or more axes. User feedback of a floating door exposes a perceived lack of rigidity and associated poor quality.

The perceived lack of rigidity and poor quality has hindered the implementation of a floating door system.

Therefore, there is an unmet need in the art for a drawer door RF seal system that is stable, able to support uniform seal compression for superior RF isolation, inexpensive to manufacture, and is compatible with existing drawer door interfaces.

SUMMARY OF THE INVENTION

The floating drawer door system of the present invention establishes structural stability through the use of three points of contact between the drawer door and the drawer base, whenever the drawer door is not engaged with the sealing portion of the associated frame. As the door approaches the frame, two of the three contact points are deactivated, allowing the drawer the freedom to pivot from a point near the seal centroid. A pivoting gimbal system provides the primary contact point. By using the gimbal, employing two-axes of rotation, rotation in the third axis is restricted. Two spring plungers are employed, referencing into conical detents, to provide the remaining two contact points. The implementation of the spring plungers is twofold. Retracting the plungers from the detents allows the drawer door gimbal to apply the closing force at the centroid of the gasket interaction line.

As the door approaches the frame, two of the three contact points are deactivated. This occurs when the spring plungers are retracted, by pushing them out of their detents. To do this, a pin is employed to apply a force against the nose of the plunger. The pin is displaced by a trigger mechanism. The trigger is displaced as it contacts a dowel pin installed in the frame. The dowel pin is strategically positioned such that it cams the trigger just as the door approaches its mating surface. One activation pin, one dowel pin, and one trigger are employed for each of the two spring plungers according to an embodiment of the present invention.

The release of two of the three contact points allows the drawer door to float in order to utilize the functionality of the two-axis gimbal system. This floating system allows the mating surfaces to be parallel and not deflect as the forces resulting from gasket compression are applied. To help achieve this, the mating force is applied to the centroid of the force line. The gimbal prevents distortion due to off-center loading, by its location at the centroid through which the load is applied. The floating gimbal system also allows the door to float in order to maintain force uniformity as the compression seal is applied.

BRIEF DESCRIPTION OF THE DRAWINGS

The features of the invention believed to be novel are set forth with particularity in the appended claims. The invention itself however, both as to organization and method of operation, together with objects and advantages thereof, may be best understood by reference to the following detailed description of the invention, which describes certain exemplary embodiments of the invention, taken in conjunction with the accompanying drawings in which:

DETAILED DESCRIPTION OF THE INVENTION

Figure 1:
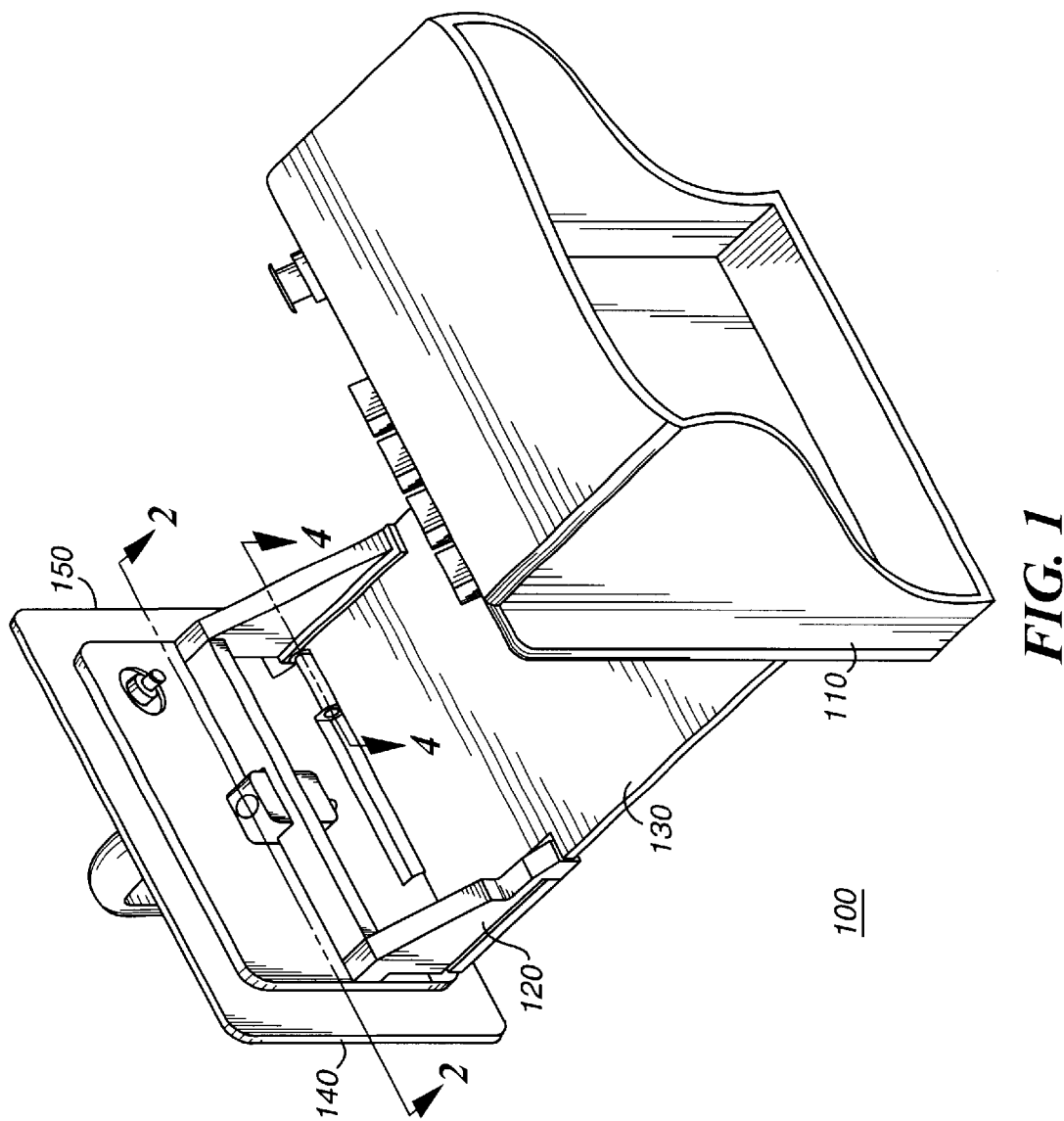
FIG. 1 is a drawing of the floating door system, according to an embodiment of the present invention.

While this invention is susceptible of embodiment in many different forms, there is shown in the drawings and will herein be described in detail specific embodiments, with the understanding that the present disclosure is to be considered as an example of the principles of the invention and not intended to limit the invention to the specific embodiments shown and described. In the description below, like reference numerals are used to describe the same, similar or corresponding parts in the several views of the drawings.

Referring now to FIG. 1, a diagram of a floating door system 100 is shown, according to an embodiment of the present invention. Floating door system 100 comprises a drawer door 140 coupled to RF seal 150. RF seal 150 is the interface to RF enclosure 110 for providing uniform RF isolation. RF seal 150 is coupled to a two-axis gimbal 120. The two-axis gimbal 120 provides freedom in a horizontal direction and a vertical direction with respect to RF enclosure 110 to ensure uniform seal compression. It should also be noted that the two-axis gimbal could also incorporate a third rotational axis. This third axis could be applied, for example, when the RF seal 150 is circular.

Two-axis gimbal 120 is coupled to drawer frame 130. Drawer door 140 is also coupled to drawer frame 130. The drawer frame 130 provides stability and support for floating door system 100, and has points of insertion within the RF enclosure 110.

Figure 2:
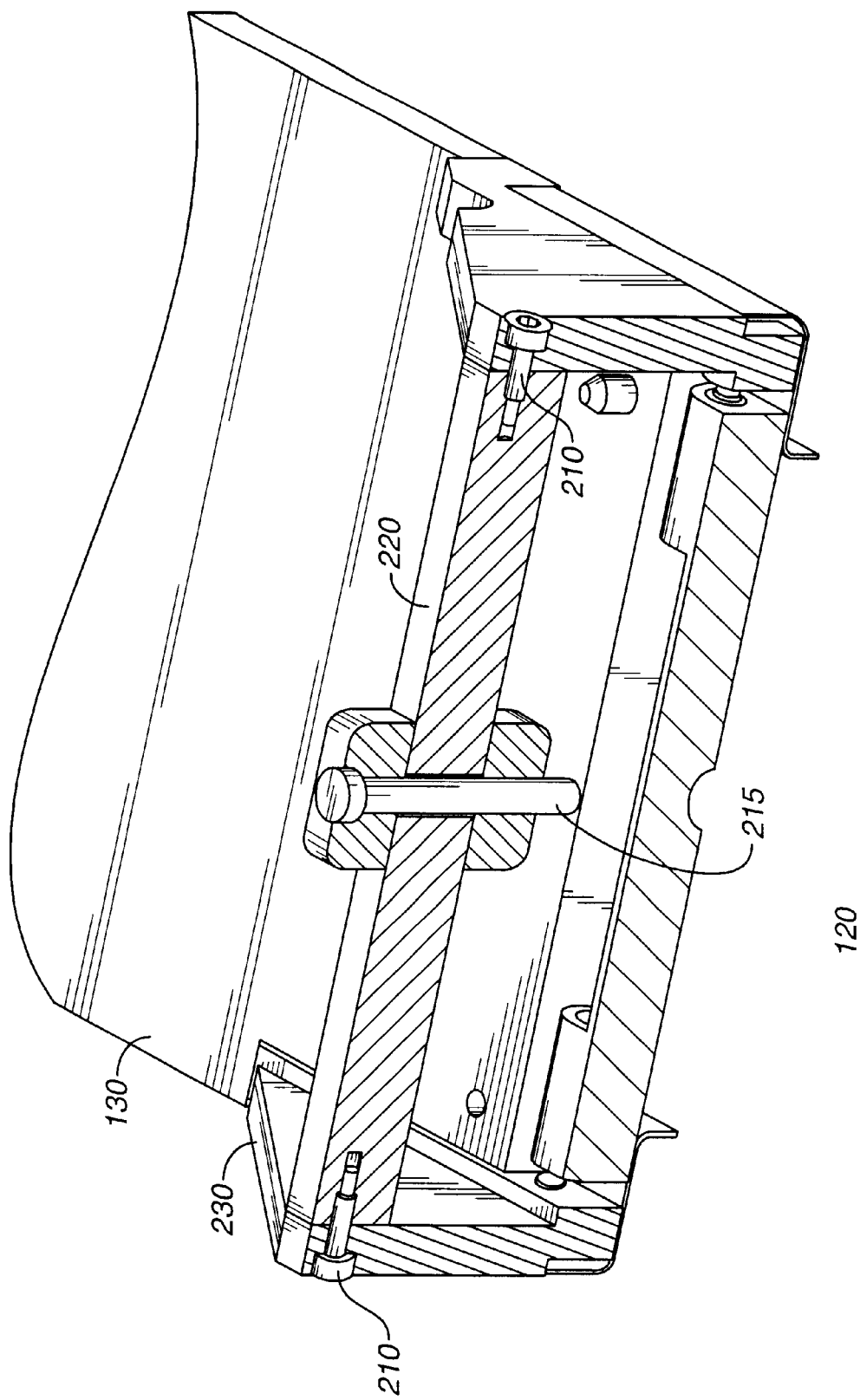
FIG. 2 is a drawing of the drawer assembly two-axis gimbal system, according to an embodiment of the present invention.

Referring now to FIG. 2, a side view of the two-axis gimbal 120 is shown. Two-axis gimbal 120 contains a base 230 that provides the points of attachment to drawer frame 130. Base 230 provides stability for the two-axis gimbal system 120 and distributes the load of the two-axis gimbal 120 across drawer frame 130.

Two-axis gimbal 120 also contains two horizontal pivot points 210 and one vertical pivot point 215. Pivot points 210 allow for motion with respect to a horizontal axis, while pivot point 215 allows for motion with respect to a vertical axis. Each of the three pivot points 210 and 215 are coupled to drawer mounting bar 220. Drawer mounting bar 220 provides a base of support for the pivot points and also provides a point of attachment for drawer door 140.

Figure 3:
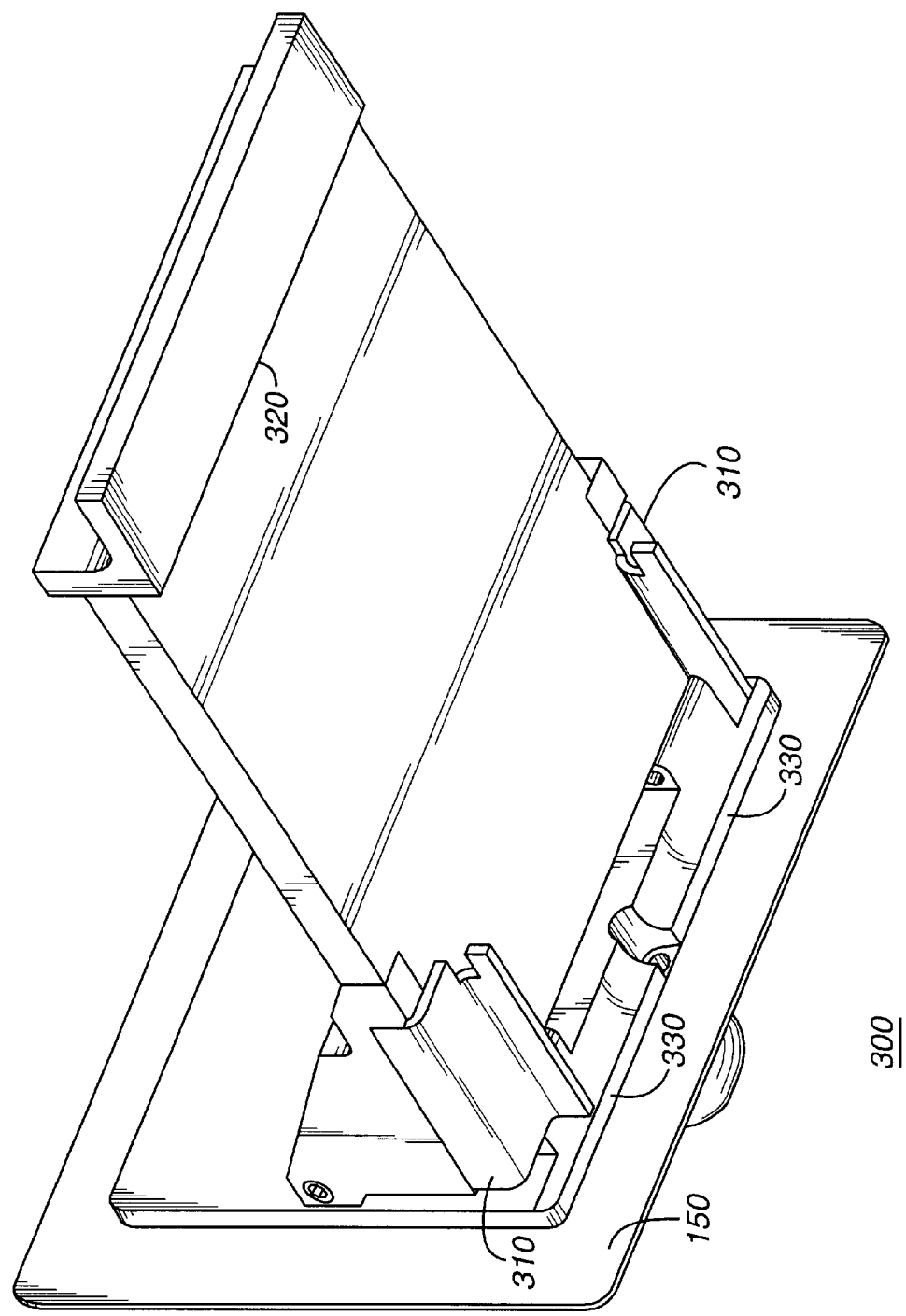
FIG. 3 is a drawing of the gimbal lock system, according to an embodiment of the present invention.

Referring now to FIG. 3, a drawing of drawer engagement components 300 are shown, according to an embodiment of the present invention. Drawer engagement components 300 ensure that as the floating door system 100 contacts the RF enclosure 110, door 140 is able to move with two degrees of freedom. These degrees of freedom are provided by the two-axis gimbal 120.

Until door 140 contacts RF enclosure 110, door 140 is held in a rigid position with no degrees of freedom, although the entire floating door system is free to move along the axis perpendicular to door 140. As floating door system 100 contacts RF enclosure 110, spring plunger release pin actuating triggers 310 contact dowel pins 320 installed in RF enclosure 110. The dowel pins 320 are located such that the spring plunger releaser pin actuating triggers 310 are cammed just as door 140 approaches a mating surface of RF enclosure 110. Displacement of spring plunger releaser pin actuating triggers 310 cause actuating pins to apply a force against the nose of spring plungers 330. Spring plungers 330 are then retracted so that two-axis gimbal 120 is operable to move with two degrees of freedom. In the preferred embodiment of the present invention, one activation pin, one dowel pin, and one trigger are used for each of two spring plungers.

Figure 4:
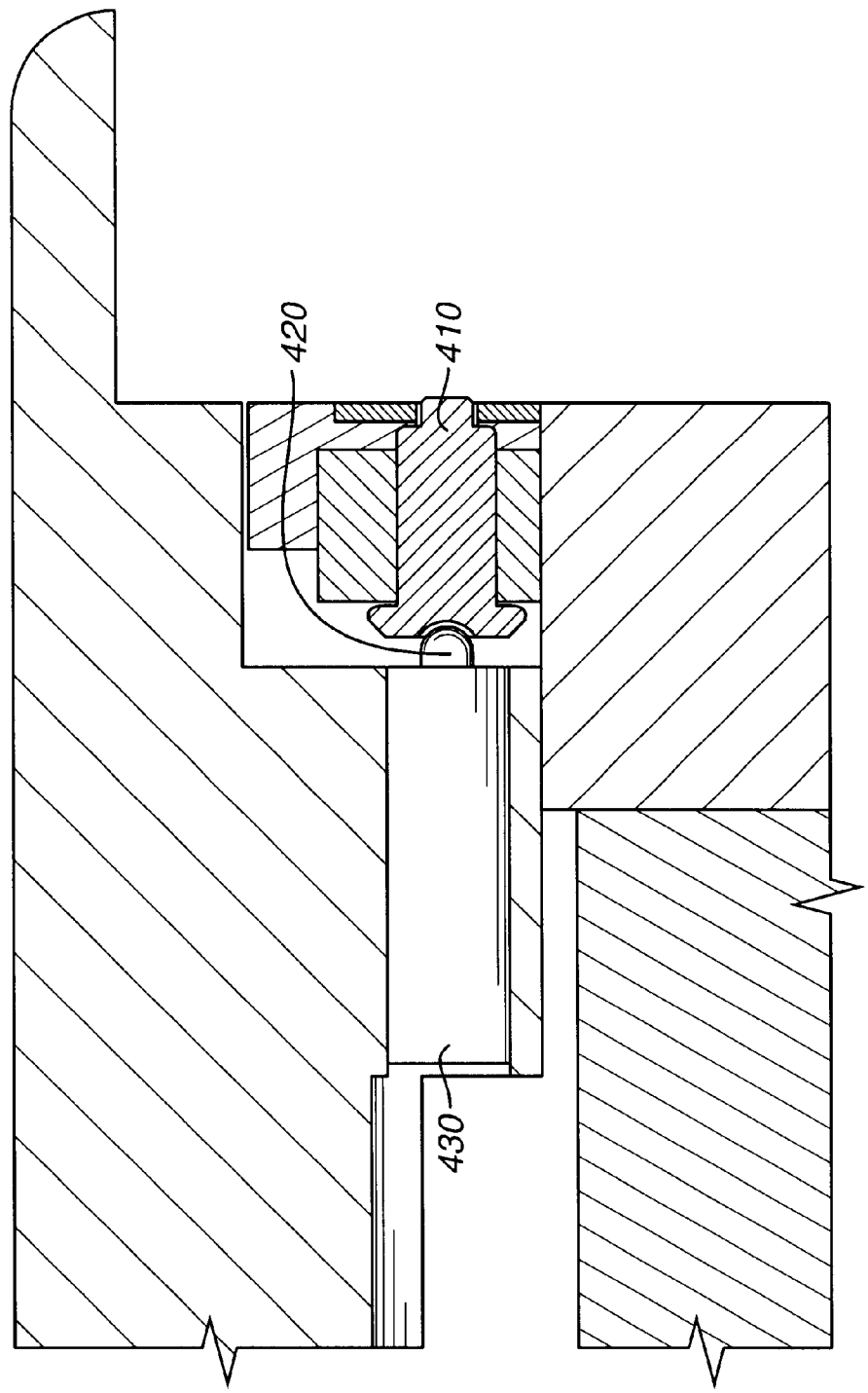
FIG. 4 is a cross sectional view of the gimbal lock mechanism, according to an embodiment of the present invention.

Referring now to FIG. 4, a cross sectional view of the gimbal lock mechanism 400 is shown. In the cross sectional view, it can be seen that spring plunger release pin 410 is coupled to hollow spring plunger detent 420. Spring plunger 430 is also coupled to hollow spring plunger detent 420, so that spring plunger 430 lies in the conical hollow of spring plunger detent 420.

Figure 5:
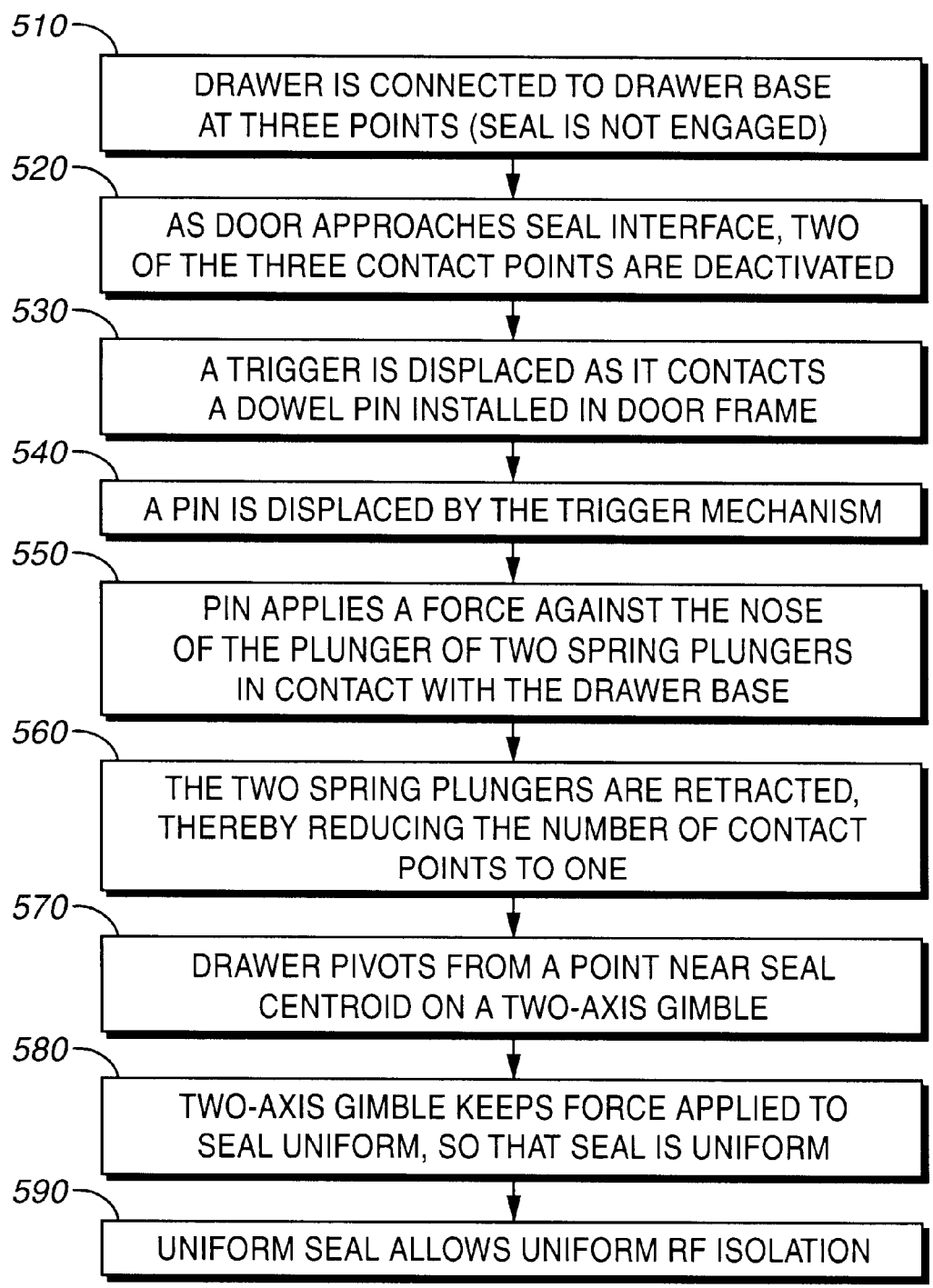
FIG. 5 is a flow chart of a method of achieving an RF seal between the door and RF enclosure, according to an embodiment of the present invention.

Referring now to FIG. 5, a method of engaging the RF seal between floating door system 100 and RF enclosure 110 is shown. In block 510, it is assumed that drawer door 140 is coupled to drawer base 130 at three points, so that the RF seal is not engaged. As the drawer door 140 approaches RF enclosure 110, two of the three contact points may be deactivated (block 520). This deactivation occurs when a trigger 310 is displaced as it contacts a dowel pin installed in door frame 150 (block 530). Trigger 310 actuation causes spring plunger release pin 410 to be displaced (block 540). Spring plunger release pin 410 applies a force against nose of plunger of two spring plungers 430 in contact with drawer base 130 through hollow spring plunger detents 420 (block 550). Two spring plungers 430 are retracted, so that the only contact point between drawer door 140 and drawer base 130 is interface between drawer door 140 and two-axis gimbal 120 (block 560). Drawer door 140 is now able to pivot from a point near seal centroid using two-axis gimbal 120 (block 570). As door seal 150 contacts RF enclosure 110, two-axis gimbal 120 allows uniform force across length of seal, so that seal compression is uniform (block 580). Uniform seal compression implies uniform RF isolation (block 590) when drawer door 140 is closed.

Those of ordinary skill in the art will recognize that the present invention has been described in terms of exemplary embodiments. In particular, it should be noted that a number of spring plungers different from two may be used without departing from the spirit and scope of the present invention. It should also be noted that the gimbal system could employ one or three axes as well.

While the invention has been described in conjunction with specific embodiments, it is evident that many alternatives, modifications, permutations and variations will become apparent to those of ordinary skill in the art in light of the foregoing description. Accordingly, it is intended that the present invention embrace all such alternatives, modifications and variations as fall within the scope of the appended claims.

What is claimed is:

1. A system operable for creating an RF seal between said system and an RF enclosure, further comprising:
    a door;
    a multiple-axis gimbal device, coupled to the door in one or more locations, said multiple-axis gimbal device held in a rigid position until said system contacts said RF enclosure;
    a release mechanism, coupled to the multiple-axis gimbal device, wherein said release mechanism permits the multiple-axis gimbal device free range of motion after said system contacts the RE enclosure; and
    a seal coupled to the door, wherein the free range of motion of the multiple-axis gimbal device provides uniform compression of said seal with the RF enclosure when a compression force is applied to the RF seal.

2. The system of claim 1, wherein the RF seal has a rectangular shape.

3. The system of claim 1, wherein the door is further coupled to a sliding drawer.

4. The system of claim 1, wherein the number of axes of the multiple-axes gimbal device is 2.

5. The system of claim 1, wherein the compression force is applied at a centroid of the seal.

6. The system of claim 1, wherein the door is further coupled to a drawer, said drawer further comprising a base coupled to the door and coupled to the RF enclosure.

7. The system of claim 1, where the multiple-axis gimbal device is coupled to the door in three locations.

8. The system of claim 1, wherein the release mechanism further comprises:

one or more spring plungers, coupled to the door, and coupled to one or more corresponding pins, said one or more corresponding pins operable to retract the one or more spring plungers; and one or more corresponding triggers, coupled to the one or more corresponding actuating pins, said one or more corresponding triggers operable to displace the one or more corresponding actuating pins upon contact with the RF enclosure.

9. The system of claim 8, wherein two spring plungers, two actuating pins, and two triggers are used in the release mechanism.

10. The system of claim 1, wherein the multiple-axis gimbal further comprises:

a base assembly, coupled to a base of the door;

a door interface, coupled to the door at a centroid of the compression forces;

one or more horizontal pivot points, coupled to a door mounting bar, said door mounting bar coupled to the door; and one or more vertical pivot points, coupled to the door mounting bar.

11. The system of claim 10, wherein the multiple-axis gimbal has a horizontal axis and a vertical axis, oriented with respect to the door.

12. A method for creating an RF seal between a door and an RF enclosure, further comprising:

a release mechanism, coupled to a rigid multiple-axis gimbal device wherein said multiple-axis gimbal device is coupled to the door, contacting the RF enclosure at one or more points; and said release mechanism, upon contacting the RF enclosure at one or more points, operably allowing the rigid multiple-axis gimbal device to obtain freedom of motion in one or more of a number of axes of the multiple-axis gimbal device;

whereupon said multiple-axis gimbal device is operable to evenly distribute a force of compression between a seal coupled to the door and said RF enclosure.

13. The method of claim 12, wherein the force of compression is applied at the seal centroid.

14. The method of claim 12, wherein a number of axes of the multiple-axis gimbal device is two.

15. The method of claim 12, wherein the release mechanism contacts the door at three points.

16. The method of claim 12, wherein the release mechanism allowing the rigid multiple-axis gimbal device to obtain freedom of motion further comprises:

displacing one or more triggers, coupled to the release mechanism, as the one or more triggers contact one or more corresponding dowel pins installed in RF enclosure;

the one or more trigger displacements causing one or more spring plunger release pins to be displaced;

the one or more spring plunger release pins applying a force against one or more corresponding spring plungers, said one or more spring plungers coupled to multiple-axis gimbal device and the door; and the one or more spring plungers being retracted.

17. The method of claim 16, wherein upon after the one or more spring plungers are retracted, the release mechanism is coupled to the door.

* * * * *